No. 12,152. REISSUED SEPT. 8, 1903.
J. S. STONE.
METHOD OF AMPLIFYING ELECTROMAGNETIC SIGNAL WAVES.
APPLICATION FILED AUG. 18, 1903.
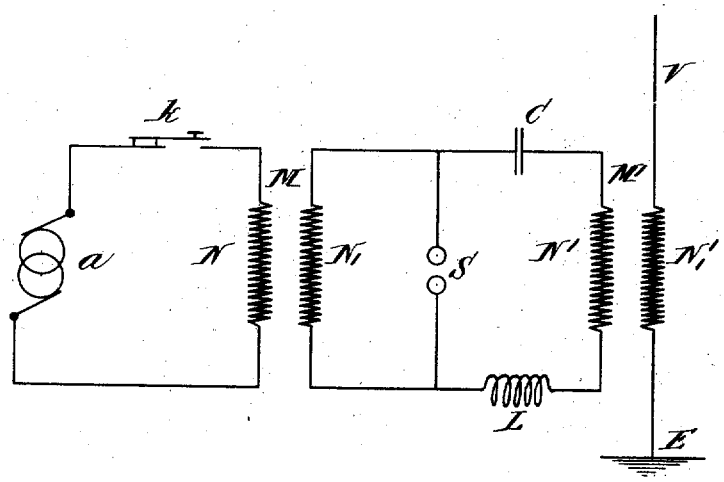
WITNESSES:
Bramwell F. Jenkins
G. Adelaide Higgins.
INVENTOR:
John Stone Stone
by Alex. P. Browne,
attorney No. 12,152. Reissued September 8, 1903.

UNITED STATES PATENT OFFICE.

JOHN STONE STONE, OF BOSTON, MASSACHUSETTS, ASSIGNOR, BY MESNE ASSIGNMENTS, TO THE STONE TELEGRAPH AND TELEPHONE COMPANY, OF PORTLAND, MAINE, AND BOSTON, MASSACHUSETTS, A CORPORATION OF MAINE.

METHOD OF AMPLIFYING ELECTROMAGNETIC SIGNAL-WAVES.

SPECIFICATION forming part of Reissued Letters Patent No. 12,152, dated September 8, 1903.

Original No. 714,333, dated December 2, 1902. Application for reissue filed August 18, 1903. Serial No. 169,884.

*To all whom it may concern:*

Be it known that I, JOHN STONE STONE, a citizen of the United States, residing at Boston, in the county of Suffolk and State of Massachusetts, have invented certain new and useful Improvements in Methods of Amplifying Electromagnetic Signal-Waves, of which the following is a specification.

My invention relates to the art of wireless or space telegraphy, and more particularly to that form of space telegraphy in which the signals emanate from an elevated conductor in the form of electromagnetic waves. Such systems shall hereinafter be designated as "elevated-conductor systems of space telegraphy."

Heretofore, as far as I am aware, in elevated-conductor systems of space telegraphy the electromagnetic waves emanating from the elevated conductor have either been of such moderate frequency as those corresponding to audible sound-waves or of such enormously greater frequencies as can at present only be obtained by the discharge of electric condensers through circuits possessing inductance. The high-frequency waves have certain advantages over the comparatively low-frequency waves for the purposes of elevated-conductor systems of space telegraphy; but whereas heretofore in the elevated-conductor systems of space telegraphy employing low frequencies the electrical oscillations in the elevated conductor are conveyed to it from a primary circuit by means of a step-up transformer, thereby greatly amplifying the amplitude of the vibrations conveyed to the elevated conductor, it has, so far as I am aware, heretofore been exclusively the practice in high-frequency elevated-conductor systems of space telegraphy to develop the electrical oscillations in the elevated conductor by causing an oscillatory discharge to take place at a spark-gap in the elevated conductor itself. This method of developing the electric oscillations directly in the vertical conductor presents the disadvantage of limiting the amplitude of the resulting oscillations to a potential difference just sufficient to produce a spark at the spark-gap in the elevated conductor.

The object of the present invention is to overcome in the high-frequency elevated-conductor system of space telegraphy the defect described above, whereby the amplitude of the electric oscillations in the elevated conductor is limited to the potential difference required to produce a spark at the spark-gap contained in the elevated conductor. This object I attain by developing the high-frequency oscillations required for the purposes of high-frequency space telegraphy in a primary circuit by the charge and discharge of an electric condenser and then causing these oscillations by means of a step-up transformer to produce inductively corresponding oscillations of increased amplitude in the elevated conductor, the amplitude of these oscillations being through the intermediary of the step-up transformer much amplified.

In my application, filed February 8, 1900, Serial No. 4,505, for method of selective electric signaling, I have disclosed the herein-described method of amplifying electromagnetic signal-waves and have therein illustrated the same embodiment of this invention as here described, but I have not therein claimed this method broadly.

An embodiment of this invention is depicted in the drawing which accompanies and forms a part of this specification.

The figure is a diagram illustrating an organization of circuits and apparatus for producing electrical oscillations of great amplitude in an elevated conductor.

In the diagram, *a* is a generator of current of a relatively moderate frequency.

*k* is a key by means of which the operation of the apparatus as a whole may be controlled and whereby oscillations may be developed or not in an elevated conductor at the will of the operator.

M is an induction-coil or step-up transformer whose primary and secondary are designated as N and $N_1$, respectively.

S is a spark-gap.

C is a condenser.

M′ is a second step-up transformer, whose primary and secondary are designated by N′ and $N_1$, respectively.

The elevated conductor V is grounded at the earth connection E.

The operation of the apparatus is as follows: When set in motion in any suitable manner, the generator *a* develops an alternating electromotive force of relatively moderate frequency, which when the key *k* is depressed develops a current in the primary circuit *a k* N. This current induces a very high potential alternating electromotive force in the secondary coil $N_1$, which tends to alternately charge the condenser C to a high potential, first in one direction and then in the other, but the spark-gap S is so adjusted that when the condenser is charged almost to its maximum in either direction a spark passes at S and the condenser is thereby permitted to discharge through the circuit S N′ C. This discharge is oscillatory in character owing to the inductance of the coil N′ or to the inductance of an auxiliary coil, (shown in the drawing at L,) which is introduced in the circuit S N′ C for the purpose of controlling the frequency of the resulting vibrations. This coil is shown in my application hereinbefore referred to, and its function in determining a simple harmonic wave is therein fully described. The vibrations in the primary N′ induce vibrations of much greater amplitude in the secondary conductor V $N'_1$ E, and these latter give rise to electromagnetic waves whose amplitude and frequency correspond to the amplitude and frequency of the electric oscillations. In this manner electromagnetic waves are caused to emanate from the vertical conductor which are of greater amplitude than it would be possible to produce from a corresponding elevated conductor in which the electric oscillations are produced by charging the conductor to a high potential and then permitting the conductor to discharge to earth. By manipulating the key *k* in accordance with a predetermined code telegraphic messages may be transmitted from the elevated conductor by electromagnetic waves emanating therefrom, and the message so transmitted may be received by any suitable elevated-conductor space-telegraph receiver within the range of influence of the transmitting elevated conductor V.

Certain precautions must be taken in the construction of the coil M′ in order to overcome the effects of dielectric and magnetic hysteresis and the effects of capacity and conductance leakage between the various convolutions of the coil, but these precautions are no different from those which have for long been recognized as necessary in the construction of inductance-coils to be used in high-frequency circuits. For a given dielectric medium the conditions governing conductive and inductive or capacity leakage are practically identical. The wire must be of relatively small diameter, and the distance separating two convolutions between which a considerable difference of potential exists during the operation of the apparatus should be relatively large. For this purpose flat spirals have been employed, but any other convenient form may be employed, provided such proportions are taken as will sufficiently diminish the electrostatic capacity of the convolutions between which high differences of potential occur during the operation of the apparatus. The necessity of avoiding dielectric and magnetic hysteresis makes it necessary to avoid as much as possible the use of solid and liquid dielectrics having great dielectric hysteresis and also imposes the condition that no iron shall be placed in or about the coils, except it be so placed as to have but slight induction developed in it by the current in the coil.

As soon as the spark-gap *s* has been broken down the greatest differences of potential in the circuit S C N′ occur at the condenser C, and it is there that the displacement-current is greatest. For this reason it is necessary to so construct the condenser C that there shall be a minimum of dielectric hysteresis. This may be most easily accomplished by using an air-condenser, though it is possible that some other dielectric, either solid or liquid, may be found to be sufficiently free from dielectric hysteresis, yet, so far as my experience extends, air is the preferred dielectric to employ in the condenser. When the circuit S C N′ is supporting the oscillating discharge of the condenser C, the greatest magnetization occurs in the said coil N′ or in the hereinbefore-mentioned auxiliary coil employed to control the frequency of the oscillations. For this reason it is necessary to so construct the coil N′ and the auxiliary coil as to minimize the magnetic hysteresis in them. This result may be accomplished by excluding iron or other paramagnetic materials from these coils and from their immediate neighborhood. Though it may be possible to employ finely-divided soft iron embedded in a dielectric matrix to enhance the magnetization in these coils, I am not prepared to recommend the use of such material as a core for the coils, and, so far as my experience extends, coils from the construction of which all paramagnetic material is excluded are the preferred coils to employ in the circuit S C N′. Though the displacement-currents are greatest at the condenser, there is nevertheless, as hereinbefore stated, inductive or capacity leakage between the turns of the coil—*i. e.*, displacement-currents flow between the convolutions of the coil, and these displacement-currents, as well as the hysteretic losses which they may involve, should be minimized in the manner hereinbefore described, but it is not necessary to indefinitely diminish these displacement-currents, and it is sufficient to so design the coils that they shall behave for currents of the frequency used practically like a conductor having a fixed inductance and a fixed resistance, but devoid of appreciable capacity. Coils constructed in the usual way do not behave for high frequencies as if they had a fixed resistance and inductance and no capacity, but partake more of the character of conductors having distributed resistance, inductance, and capacity. In fact, they may in some instances behave with high frequencies more like condensers than like conductors having fixed resistance and inductance and no capacity. Since a coil constructed in the usual way behaves for high frequencies as a conductor having distributed resistance, inductance, and capacity, it follows that such a coil will show for high frequencies the same quasi resonance as is observed with low frequencies in long aerial lines and cables—*i. e.*, that it will *per se* and without the intermediary of a condenser show a slight degree of selectivity for some particular frequency and for certain multiples of that frequency, just as a stretched string which has distributed inertia and elasticity will respond to a particular tone called its "fundamental" and to all other tones whose periods are aliquot parts of the periods of that fundamental, but it is not with such quasi resonance that the present invention is carried into effect. A general criterion which determines the utility of a coil for tuning a circuit to a particular high frequency is that the potential energy of the displacement-currents in the coil shall be small compared to the kinetic energy of the conduction-current flowing through the coil when the coil is traversed by a current of that frequency. I have found that for a single-layer coil the following procedure is sufficient for practical purposes: Determine the inductance of the coil by formulæ to be found in the text-books and treatises on electricity and magnetism. This will enable the kinetic energy of the coil to be determined for any particular current and will also permit of the determination of what would be the potential gradient along the coil for the current of the frequency to be employed if the coil were devoid of distributed electrostatic capacity. Next, calculate the electrostatic capacity between an end turn and each of the remaining turns of the coil. These capacities, together with the potential gradient found, will enable the potential energy to be determined, and if the ratio of the potential energy to the kinetic energy so found be negligible compared to unity the coil will practically satisfy the requirements hereinbefore mentioned. If the coil does not meet the requirements, the design should be so changed as to increase the separation between the turns, or the size of the wire should be diminished or the dimensions of the coil so otherwise altered as to decrease the distributed capacity without proportionately diminishing the inductance. The calculations may be greatly abbreviated and the liability to error greatly reduced if the results of the computations be plotted in curves. Regarding the effect of a dielectric core in a coil to be used for tuning a circuit to a high frequency, it is sufficient to state that the preferred form of support for such a coil is any skeleton frame which will hold the turns of wire in place without exposing much surface of contact to the wires and affording a minimum of opportunity for the development of displacement-currents within itself. This form of skeleton frame is well known in the art, having been fully described in Vol. 49 (1900–1901) of the *Journal of the Society of Arts*, London, in the report of a lecture by Prof. J. A. Fleming. It is by no means necessary to use this support, but I find it a convenient means for accomplishing the present result.

The injunctions hereinbefore given regarding the construction of the coils to be employed in circuit S C N′ apply with equal force to both the coil M′ and the auxiliary coil used to control the frequency of the oscillations in this resonant circuit; but the coil N′ may be made to perform the function of the auxiliary coil and control the frequency of the oscillations, or, what amounts to the same thing, the auxiliary coil may be made a part of the coil N′, which then performs both functions—*i. e.*, of controlling the frequency of the oscillations and of impressing these oscillations upon the elevated conductor. This double function may be performed by the coil N′ if it be so designed that its self-induction is made large compared to the ratio of the mutual induction between the coils to the product of the inductance of the primary coil by the inductance of the secondary—*i. e.*, $M^2 < L_1 L_2$. This simply means that the inductance of the auxiliary coil must be added to the inductance of N′ without appreciably increasing the mutual inductance between that coil and the secondary coil $N'_1$. The performance of the apparatus is the same, whether the auxiliary inductance necessary to control the frequency of the oscillations be located in a separate coil or incorporated in the coil N′ of the transformer M′, though it will be found in practice more convenient to locate the auxiliary inductance in a separate coil, owing to the greater complexity of the numerical calculations which have to be made when the auxiliary inductance is to be furnished by the coil N′.

I am aware of the patents Nos. 645,576 and 649,621 to Nikola Tesla, which disclose a method and apparatus for impressing on an aerial conductor oscillations of high frequency by means of a transformer, but in said patents no method or means are disclosed for producing simple harmonic waves, and, furthermore, as the system therein disclosed is for the transmission of electrical energy by conduction through a rarefied atmosphere a simple harmonic wave is not necessary; but as I am the first to discover the utility of a simple harmonic wave in the transmission of intelligence by electromagnetic waves by the system disclosed in my application aforesaid and am the first to discover the method for producing said wave form effectively I claim herein broadly a method of amplifying said electromagnetic waves.

It is to be definitely understood that the present invention is not confined to the special form of apparatus shown and described in this specification, as means of developing simple harmonic electric vibrations in the primary circuit of the coil M′ any suitable means of developing simple harmonic electric vibrations in the primary of the coil M′ being consistent with the invention.

What I claim is—

1. The method of developing high-frequency simple harmonic electromagnetic signal-waves, which consists in producing simple harmonic electric oscillations of corresponding frequency in a primary circuit and causing the same to inductively reproduce corresponding simple harmonic oscillations at increased amplitude in an elevated conductor.

2. The method of transmitting electromagnetic signal-waves, which consists in generating electric oscillations in a closed oscillating electric circuit, impressing said oscillations on an elevated conductor at increased amplitude, and swamping the effect of the mutual inductance between the closed oscillating circuit and the elevated conductor, whereby said oscillating circuit oscillates as a system having a single degree of freedom.

JOHN STONE STONE.

Witnesses:
ALEX. P. BROWNE,
G. A. HIGGINS.